(12) United States Patent
Cheng et al.

(10) Patent No.: US 9,318,553 B1
(45) Date of Patent: Apr. 19, 2016

(54) NANOWIRE DEVICE WITH IMPROVED EPITAXY

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/515,764

(22) Filed: Oct. 16, 2014

(51) Int. Cl.
| | | |
|---|---|---|
| H01L 29/16 | (2006.01) | |
| H01L 29/06 | (2006.01) | |
| H01L 29/66 | (2006.01) | |
| H01L 29/04 | (2006.01) | |
| H01L 21/02 | (2006.01) | |
| H01L 29/167 | (2006.01) | |
| H01L 29/786 | (2006.01) | |

(52) U.S. Cl.
CPC ........ *H01L 29/0673* (2013.01); *H01L 21/0257* (2013.01); *H01L 21/02422* (2013.01); *H01L 21/02433* (2013.01); *H01L 21/02529* (2013.01); *H01L 21/02532* (2013.01); *H01L 29/045* (2013.01); *H01L 29/0649* (2013.01); *H01L 29/167* (2013.01); *H01L 29/66742* (2013.01); *H01L 29/78696* (2013.01)

(58) Field of Classification Search
CPC .............. H01L 29/0673; H01L 29/167; H01L 29/0649; H01L 21/0257; H01L 29/66742; H01L 21/02422; H01L 21/02532; H01L 21/02433; H01L 21/02529; H01L 29/045; H01L 29/78696

See application file for complete search history.

(56) References Cited

U.S. PATENT DOCUMENTS

| | | | |
|---|---|---|---|
| 7,402,483 | B2 | 7/2008 | Yun et al. |
| 7,648,883 | B2 | 1/2010 | Park |
| 7,892,945 | B2 | 2/2011 | Bedell et al. |
| 7,999,251 | B2 | 8/2011 | Chu et al. |
| 8,298,881 | B2 | 10/2012 | Sleight et al. |

(Continued)

OTHER PUBLICATIONS

Ernst et al., "Novel 3D integration process for highly scalable Nano-Beam stacked-channels GAA (NBG) FinFETs with HfO2/TiN gate stack", Nov. 1, 2006, pp. 1-4, Electronic Devices Meeting, 2006, IEDM '06, International, IEEE, DOI: 10.1109/IEDM.2006.346955.
Fang, et al., "Vertically Stacked SiGe Nanowire Array Channel CMOS Transistors", IEEE Electron Device Letters, vol. 28, No. 3, Mar. 2007, pp. 211-213, © 2007 IEEE.

(Continued)

*Primary Examiner* — Roy Potter
*Assistant Examiner* — Paul Patton
(74) *Attorney, Agent, or Firm* — Olivia R. Scheuer

(57) ABSTRACT

As disclosed herein, a method for fabricating a nanowire device with improved epitaxy, includes forming a nanowire stack on a substrate, the nanowire stack having one or more sacrificial layers, where the substrate includes a bulk substrate, an oxide layer, and an extremely thin silicon (ETSOI) layer, removing the sacrificial layers, depositing and patterning a gate material over the nanowire stack, the gate material having sidewalls, covering the sidewalls of the gate material with a spacer layer, and epitaxially growing an in-situ doped layer comprised of doped silicon from the ETSOI layer. The ETSOI may have a (100) crystallographic orientation. A pFET source/drain may be epitaxially grown by including an in-situ doped layer of boron doped SiGe. An nFET source/drain may be epitaxially grown by including an in-situ doped layer of phosphorus doped Si:C. A device corresponding to the method is also disclosed herein.

18 Claims, 4 Drawing Sheets

(56) References Cited

U.S. PATENT DOCUMENTS

| | | |
|---|---|---|
| 8,441,043 B2 | 5/2013 | Bangsaruntip et al. |
| 8,551,833 B2 | 10/2013 | Chang et al. |
| 2012/0138886 A1 | 6/2012 | Kuhn et al. |
| 2013/0341704 A1* | 12/2013 | Rachmady ........ H01L 29/66545 257/327 |
| 2014/0001441 A1* | 1/2014 | Kim .................... H01L 29/0673 257/29 |

OTHER PUBLICATIONS

Hashemi, et al., "Advanced Strained-Silicon and Core-Shell Si/Si1-xGex Nanowires for CMOS Transport Enhancement", 2010, ECS Transactions, 33 (6) pp. 687-698, 10.1149/1.3487599 © The Electrochemical Society.

Tachi, et al., "3D Source/Drain Doping Optimization in Multi-Channel MOSFET", Proceedings of the European Solid-State Device Research Conference (ESSDERC), 2010, pp. 368-371.

* cited by examiner

US 9,318,553 B1

NANOWIRE DEVICE WITH IMPROVED EPITAXY

BACKGROUND OF THE INVENTION

The present invention relates generally to the field of semiconductor devices, and more particularly to stacked nanowire devices.

There is a growing demand in the electronics market for smaller devices. To satisfy the wants and needs of consumers, the individual components of integrated circuits must decrease in size. While integrated circuit manufacturers have been successful in exponentially decreasing the size of the components on the integrated circuit, design challenges have surfaced along the way.

Transistors are an integral element of the integrated circuit. Reducing the size of the transistor also reduces the size of the integrated circuit. However, as the transistor—and therefore the individual elements of the transistor—has decreased in size, problems have developed with voltage leaking across the gate region. To meet the needs of the electronic industry, integrated circuit designers must finds ways to minimize voltage leaks.

SUMMARY

As disclosed herein, a method for fabricating a nanowire device with improved epitaxy, includes forming a nanowire stack on a substrate, the nanowire stack having one or more sacrificial layers, where the substrate includes a bulk substrate, an oxide layer, and an extremely thin silicon-on-insulator (ETSOI) layer, removing the sacrificial layers, depositing and patterning a gate material over the nanowire stack, the gate material having sidewalls, covering the sidewalls of the gate material with a spacer layer, and epitaxially growing an in-situ doped layer comprised of doped silicon from the ETSOI layer. The ETSOI may have a (100) crystallographic orientation. The nanowire stack and spacer layer may be etched. A pFET source/drain may be epitaxially grown by including an in-situ doped layer of boron doped SiGe. An nFET source/drain may be epitaxially grown by including an in-situ doped layer of phosphorus doped Si:C.

As disclosed herein, a nanowire device with improved epitaxy includes a substrate, having a bulk substrate layer, an oxide layer, and an extremely thin silicon (ETSOI) layer, one or more vertically stacked nanowires on top of the substrate, a gate attached to the substrate, covering the stacked nanowires, a plurality of spacers attached to the gate, and an epitaxy layer grown up from the substrate, where the epitaxy layer is situated on either side of the gate and covers the nanowires.

DETAILED DESCRIPTION

Rapid advancements in chip-containing technologies have led to a need to decrease the size of the semiconductor devices, including transistors. However, the source/drain regions of the semiconductor devices may be compromised when the size of the circuit is decreased.

The disclosed embodiments provide a method and device for improved epitaxial source/drain regions for a semiconductor device. To create a more effective source/drain region, a large surface area is needed. Growing a source/drain region epitaxially from the substrate enables a greater surface area to be utilized than in past technologies. Additionally, nanowires may be made smaller because the surface of the wire is not needed for epitaxial growth.

Figure 1:
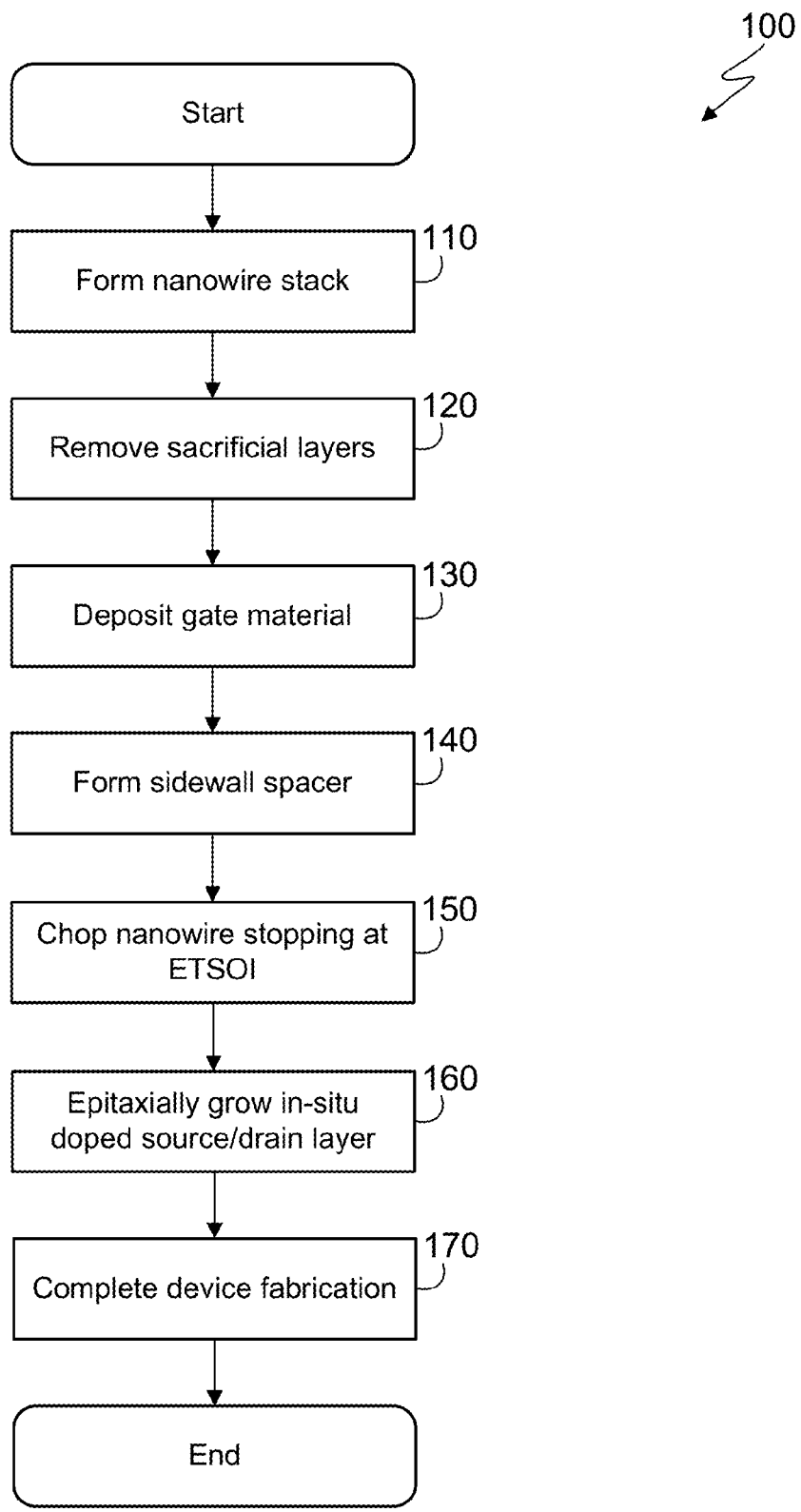
FIG. 1 is a flowchart depicting one embodiment of a nanowire device fabrication method.

FIG. 1 is a flowchart depicting one embodiment of a nanowire device fabrication method 100. As depicted, the nanowire device fabrication method 100 includes forming (110) a nanowire stack, removing (120) the sacrificial layers from the nanowire stack, depositing (130) a gate material across the nanowire stack, forming (140) the sidewall spacer layer, chopping (150) the nanowires, stopping at the ETSOI, epitaxially growing (160) an in-situ doped source/drain layer around the spacer layer, and completing (170) the device fabrication. Growing a nanowire FET using the nanowire device fabrication method 100 provides a sharp source/drain butting junction, increasing the performance of the FET.

Forming (110) a nanowire stack may include alternating layers of a semiconductor material and a sacrificial material. The layers may be deposited on an extremely thin silicon-on-insulator (ETSOI) substrate. The nanowire stack may have a lattice structure. The forming operation (110) provides the foundation of the nanowire device. The thickness of the layers determines the thickness of the resultant nanowires. Next, the vertical stack of nanowires is created by removing (120) the sacrificial layers from the nanowire stack. The remaining nanowire layers may be suspended between anchors, which run the length of the ETSOI, on each side.

Depositing (130) a gate material across the nanowire stack may include depositing material in the center of the ETSOI, which may act as a barrier between the source and drain regions of a nanowire device. The gate material may form a solid block that extends from the ETSOI to a thickness above the nanowires, where the nanowires are embedded within the gate. Next, the barrier is finished by forming (140) a sidewall spacer layer. The sidewall spacer layer may be formed over the entire device, covering the gate, nanowires, and ETSOI. Next, the method continues by chopping (150) the nanowires, stopping at the ETSOI. The chopping may be done through an etching process. The sidewall spacer layer may also be etched leaving the sidewall spacer layer attached only to the sidewalls of the gate.

Epitaxially growing (160) an in-situ doped source/drain layer around the spacer layer may include doping a silicon based compound to create the source and drain regions of a FET. To create an nFET, the silicon may be doped with a group IV element; whereas, to create a pFET, the silicon may be doped with a group III element.

Nanowire device fabrication method 100 continues with standard fabrication processes. Middle of the line and back-end-of line processes may be used in completing (170) the device fabrication.

The method as described above may be used in the fabrication of integrated circuit chips.

FIGS. 2a-f depict a cross-section of one embodiment of a nanowire device 200 at various stages in the fabrication method 100. The depicted embodiment of the nanowire device 200 includes substrate 210a, buried oxide layer 210b, extremely thin silicon-on-insulator (ETSOI) 210c, nanowires 220, nanowire stack 225, sacrificial layers 230, anchors 240, gate 250, sidewall spacer layer 260, epitaxial source/drain 270, and hard mask 280. Herein, substrate 210a, buried oxide layer 210b, and ETSOI 210c may be collectively referred to as semiconductor substrate 210. The depicted sequence shows the fabrication of a nanowire FET, though the invention may be used to fabricate other semiconductor devices not disclosed in the depicted embodiments.

In the depicted embodiment, the nanowire device 200 is fabricated on the semiconductor substrate 210. The semiconductor substrate 210 may include substrate 210a, buried oxide layer 210b, and ETSOI 210c. Semiconductor substrate 210 may have more or less layers than those depicted.

The substrate 210a may include, but is not limited to: any semiconducting material such as conventional Si-containing materials, Ge-containing materials, GaAs, InAs, and other similar materials. Si-containing materials may include Si, bulk Si, single crystal Si, polycrystalline Si, SiGe, amorphous Si, semiconductor-on-insulator substrate (SOI), SiGe-on-insulator (SGOI), annealed poly Si, and poly Si line structures. The substrate 210a may have a thickness of about, but is not limited to, 400 to 2000 microns.

The buried oxide layer 210b may be comprised of $SiO_2$, or a similar material. The buried oxide layer 210b provides a barrier between substrate 210a and the ETSOI 210c. The isolation of the substrate 210a may be required to decrease voltage leakage across the device. The thickness of the buried oxide layer 210b may range from 5 to 500 nanometers.

In the depicted embodiment, the ETSOI 210c may be a silicon layer with a (100) crystallographic orientation. The (100) crystallographic orientation may foster epitaxial growth of the source/drain layer. The use of a (100) surface may allow for enhanced epitaxial growth as compared to the traditional (110) crystallographic substrate. In the depicted embodiment, the ETSOI 210c has a thickness no greater than 20 nanometers. A variety of methods of forming the semiconductor substrate 210 are well known in the art.

Figure 2A:
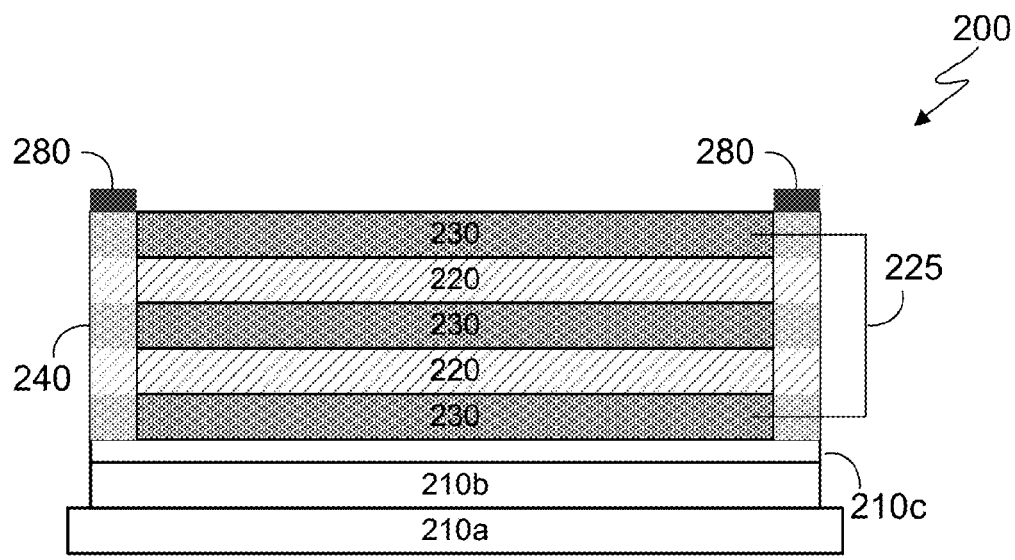
FIGS. 2a-f depict a cross-section of one embodiment of a nanowire device throughout the fabrication method of FIG. 1.

As depicted in FIG. 2a, the nanowire stack 225 may be formed on top of the ETSOI 210c. The nanowire stack 225 may include nanowires 220 and sacrificial layers 230. In the depicted embodiment, the nanowire stack 225 is a lattice formed on top of the ETSOI 210c. The nanowire stack 225 may be formed by alternating layers of silicon with layers of silicon-germanium. The nanowires 220 may be made of silicon or strained silicon. While two nanowires 220 are shown in the depicted embodiment, it should be known that the number of nanowires 220 may be increased or decreased, based on need, by adding or subtracting layers from the nanowire stack 225.

The sacrificial layers 230 may be selected based on having different etching properties than the nanowire 220 layer. By choosing the material based on etching properties, the sacrificial layer 230 may be selectively removed without damaging the nanowires 220. In the depicted embodiment the sacrificial layers 230 are made of silicon-germanium; however, germanium and III-V elements may also be used. The sacrificial layer is used to form a vertical stack of nanowires. The thickness of the sacrificial layers 230 will determine the placement of the nanowires 220 within the nanowire device; in general, the sacrificial layer 230 will be between 8 and 50 nanometers.

Figure 2B:
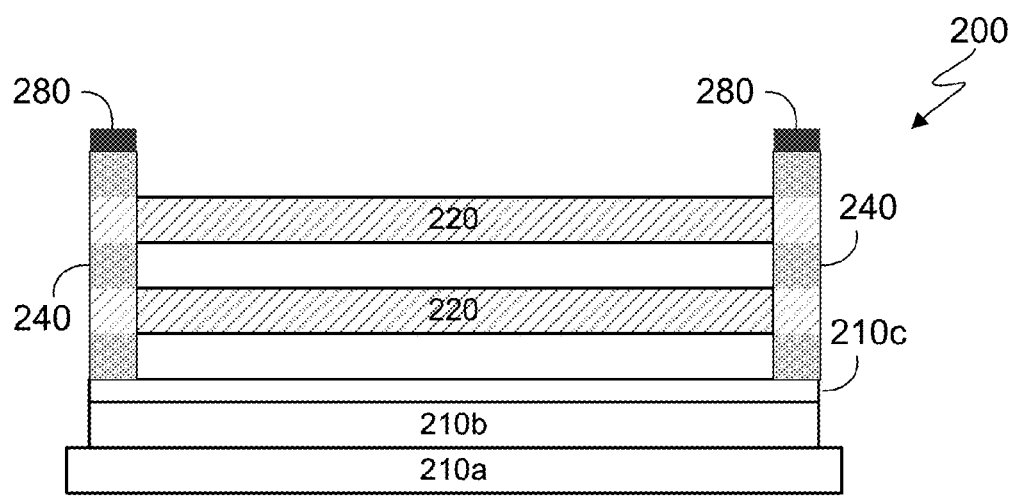

The sacrificial layers 230 may be selectively removed, as depicted in FIG. 2b. The nanowires 220 and the anchors 240 may be patterned using a hybrid lithography, for example, sidewall image transfer, optical lithography, and reactive ion etching. The sacrificial layers 230 may be removed using either a wet or dry etching process. For example, the reference "Advanced Strained-Silicon and Core-Shell $Si/Si_{1-x}Ge_x$ Nanowires for CMOS Transport Enhancement" by Hashemi et al. describes a method for wet etching. Further, the reference "Novel 3D integration process for highly scalable Nano-Beam stacked-channels GAA (NBG) FinFETs with $HfO_2$/TiN gate stack" by Ernst et al. describes a method for dry etching. The reactive ion etching is done to the surface of the ETSOI 210c. The etching is controlled by monitoring the exit gas flow. When the sacrificial layers 230 are removed, the nanowires 220 may be suspended between the anchors 240.

Anchors 240 may be grown in conjunction with the nanowire stack 225. The anchors may be grown on the ETSOI 210c. In the depicted embodiment, there are two anchors 240 that run parallel along the outer edge of the ETSOI 210c; however, the number of anchors 240 can vary, depending on fabrication needs. Like the sacrificial layers, the anchors are a building tool, and may be omitted in the finished device. The anchors may be made of the same material used to form the nanowires 220 and sacrificial layers 230. A hard mask 280 is added to the anchors 240 to protect the anchor 240 during the reactive-ion etch. The hard mask 280 is a protective layer that may inhibit chemical etching of a covered feature. The hard mask 280 may be made of materials containing nitrides, oxides, or other similar materials.

Figure 2C:
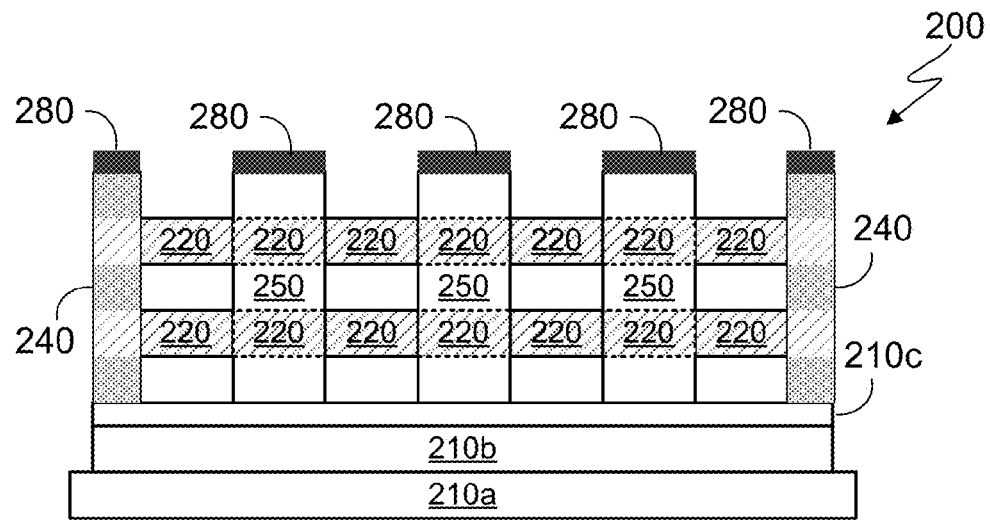

As depicted in FIG. 2c, gate 250 can be constructed over the nanowires 220. One or more gates 250 can be constructed over a stack of nanowires 220. The gate 250 extends from the ETSOI 210c to a distance of about 10 to 200 nanometers above the top nanowire 220 in the stack of nanowires. The gate 250 may be formed as a gate first or a dummy gate. For either gate formation method, the gate 250 may be a stack of dielectric—such as $SiO_2$, a high-K material such as $HfO_2$, $Al_2O_3$, $La_2O_3$, or any combination thereof—and a metal, such as TiN, TiAlN, TaN, Al, doped poly-crystalline Si, doped amorphous Si, or any combination thereof. In an embodiment using a gate first method, a permanent gate is constructed after the nanowires 220 are formed; the gate 250 will remain in the final nanowire device 200. However, in an embodiment using a dummy gate method, a temporary gate is formed after nanowires 220 are formed; later in the fabrication process, the dummy gate may be removed through chemical processes and replaced with a permanent gate.

The gate 250 may be made of a high-K material; this approach enables construction of a smaller gate 250, without compromising the dielectric properties. The gate 250 may be patterned using conventional photo-lithography, EUV lithography, e-beam lithography, sidewall image transfer, or any combination thereof, followed by a reactive ion-etch process. A hard mask 280 is added to top of the gate 250. The hard mask 280 provides a protective layer, which may inhibit etching of the gate in later processes.

Figure 2D:
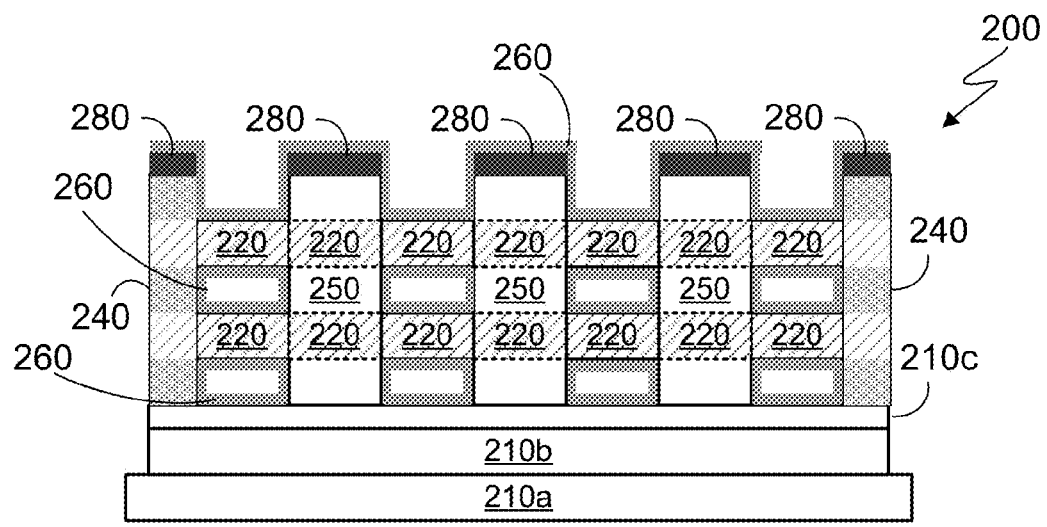
Figure 2E:
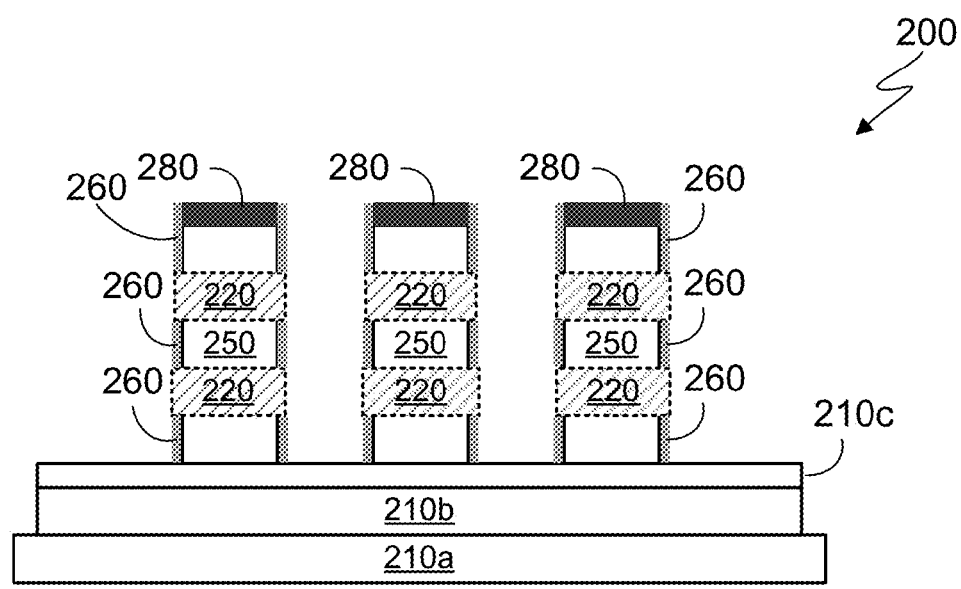

Sidewall spacer layer 260 may be formed by deposition and sit on the top and bottom of the wires, as well as on the gate and ETSOI, as depicted in FIG. 2d. Spacers may be made of Si3N4, SiON, SiOCN, SiCN, $SiO_2$, BN or any combination thereof. The sidewall spacer layer 260 may be etched, using reactive ion etching, to remove the spacer layer from the ETSOI. As shown in FIG. 2e, the nanowires 220 may be chopped during the spacer etch. The spacer etch may also cause a gap to form between the gate 240 and the spacer 250. This gap will be filled in by the epitaxial source/drain 270 layer. The gap between the gate 250 and the spacers 260 causes a sharp junction and strain, increasing the performance of the device. As a result of the wire chopping, nanowires 220 may be flush with the spacers 260. The nanowires 220 may have a substantially square, rectangular, or other cross-sectional geometry. The etching of the sidewall spacer layer 260 may prime the surface for the epitaxial growth.

Figure 2F:
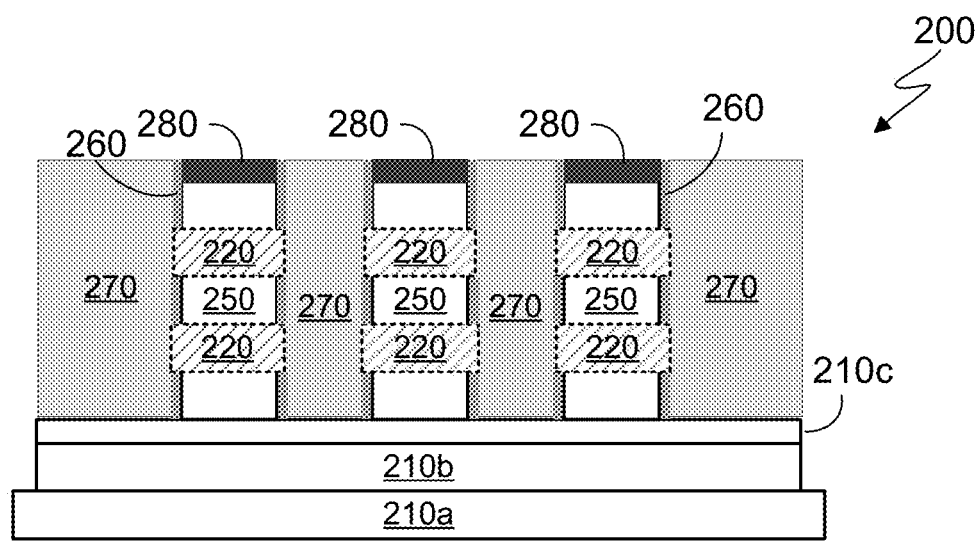

FIG. 2f depicts the creation of a source/drain region of a nanowire device. For example, doped silicon may be used to create the epitaxial source/drain 270. Silicon doped with a group three element, such as boron, will create a pFET source/drain region 270. For example, an in-situ doped layer of boron doped SiGe, Ge, GeSn, or Si may be used to create the pFET. Likewise, silicon doped with a group five element, such as phosphorus or arsenic, will create an nFET source drain region 270. For example, an in-situ doped layer of boron doped Si or SiC may create the nFET. The epitaxial source/drain may be formed bottom up from the ETSOI 210c to a bridge that covers nanowires 220; such that the nanowires are completely enclosed by gate 250, sidewall spacer layer 260, and epitaxial source/drain 270.

In certain embodiments, the method as described above is used in the fabrication of integrated circuit chips. The fabrication steps described above may be included on a semiconductor substrate consisting of many devices and one or more wiring levels to form an integrated circuit chip.

The resulting integrated circuit chip(s) can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may be then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments, or in various combinations with or without other features and elements. This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for fabricating a nanowire device with improved epitaxy, the method comprising:
    forming a nanowire stack on a substrate, the nanowire stack having one or more sacrificial layers, wherein the substrate comprises a bulk substrate, an oxide layer, and an extremely thin silicon (ETSOI) layer, wherein the ETSOI has a (100) crystallographic orientation;
    removing the sacrificial layers;
    depositing and patterning a gate material over the nanowire stack, the gate material having sidewalls;
    covering the sidewalls of the gate material with a spacer layer; and
    epitaxially growing an in-situ doped layer comprised of doped silicon from the ETSOI layer.

2. The method of claim 1, wherein epitaxially growing an in-situ doped silicon layer forms a pFET.

3. The method of claim 2, wherein the in-situ doped silicon layer comprises boron doped Si or SiGe.

4. The method of claim 1, wherein epitaxially growing an in-situ doped silicon layer forms an nFET.

5. The method of claim 4, wherein the in-situ doped silicon layer comprises phosphorus doped Si:C.

6. The method of claim 1, wherein the gate material comprises a high-K material.

7. The method of claim 1, wherein the nanowire stack comprises one or more silicon nanowires.

8. The method of claim 7, wherein the silicon nanowires are chopped.

9. A nanowire device with improved epitaxy comprising:
    a substrate, wherein the substrate comprises a bulk substrate, an oxide layer, and an extremely thin silicon (ETSOI) layer, wherein the ETSOI has a (100) crystallographic orientation;
    one or more vertically stacked nanowires on top of the substrate;
    a gate attached to the substrate, covering the stacked nanowires;
    a plurality of spacers attached to the gate; and
    an epitaxy layer grown up from the substrate, wherein the epitaxy layer is situated on either side of the gate and covers the nanowires.

10. The device of claim 9, wherein the one or more nanowire layers comprises silicon.

11. The device of claim 9, wherein the gate comprises a high-K material.

12. The device of claim 9, wherein the epitaxy layer is a pFET.

13. The device of claim 9, wherein the pFET comprises boron doped Si or SiGe.

14. The device of claim 9, wherein the epitaxy layer is an nFET.

15. The device of claim 14, wherein the nFET comprises phosphorus doped Si:C.

16. A method for fabricating a nanowire device with improved epitaxy, the method comprising:
    forming a nanowire stack on a substrate, the nanowire stack having one or more sacrificial layers and one or more nanowires, wherein the substrate comprises a bulk substrate, an oxide layer, and an extremely thin silicon (ETSOI) layer, wherein the ETSOI layer comprises a (100) crystallographic orientation;
    removing the sacrificial layers;
    depositing and patterning a gate material over the nanowire stack, the gate material having sidewalls, wherein the gate material comprises a high-K material;

covering the sidewalls of the gate material with a spacer layer;
chopping the one or more nanowires, wherein the nanowires are the same length as the gate material; and
epitaxially growing an in-situ doped layer comprised of doped silicon from the ETSOI layer.

17. The method of claim 16, wherein epitaxially growing an in-situ doped silicon layer forms a pFET, wherein the in-situ doped silicon layer comprises boron doped SiGe.

18. The method of claim 16, wherein epitaxially growing an in-situ doped silicon layer forms an nFET, wherein the in-situ doped silicon layer comprises phosphorus doped Si:C.

* * * * *